United States Patent [19]

Dingwall et al.

[11] Patent Number: 4,612,531
[45] Date of Patent: Sep. 16, 1986

[54] INTERMESHED RESISTOR NETWORK FOR ANALOG TO DIGITAL CONVERSION

[75] Inventors: Andrew G. F. Dingwall, Bridgewater Township, Somerset County; Victor Zazzu, Boro of Montvale, both of N.J.

[73] Assignee: RCA Corporation, Princeton, N.J.

[21] Appl. No.: 700,866

[22] Filed: Feb. 12, 1985

[51] Int. Cl.$^4$ ............................................. H03K 13/02
[52] U.S. Cl. ............................................. 340/347 AD
[58] Field of Search .................... 340/347 AD, 347 M

[56] References Cited

U.S. PATENT DOCUMENTS

| | | | |
|---|---|---|---|
| 3,935,569 | 1/1976 | Marcel et al. | 340/347 AD |
| 4,008,468 | 2/1977 | Imhoff et al. | 340/347 AD |
| 4,099,173 | 7/1978 | Zeskind et al. | 340/347 AD |
| 4,137,525 | 1/1979 | Tyrrel | 340/347 AD |
| 4,447,747 | 5/1984 | La Dotin | 340/347 DA X |
| 4,456,904 | 6/1984 | van de Grift | 340/347 AD |

Primary Examiner—Vit W. Miska
Attorney, Agent, or Firm—Joseph S. Tripoli; George E. Haas; Henry I. Schanzer

[57] ABSTRACT

In an A/D converter, a resistive network for producing $2^n$ different voltage steps. The resistive network includes a coarse relatively high impedance resistive string which is subdivided into $2^x$ coarse segments. The resistive network also includes a fine relatively high impedance resistive network comprised of a fine resistive element per coarse segment. Each fine resistive element is then subdivided into $2^{(n-x)}$ fine sub-segments. In determining the value of an input voltage being sensed, all the coarse segments are used to sense which coarse segments brackets the input voltage. However, only the fine segment in parallel with the "bracketing" coarse resistor is then coupled to comparator means to sense which fine sub-segment brackets the input voltage.

8 Claims, 7 Drawing Figures

PRIOR ART

INTERMESHED RESISTOR NETWORK FOR ANALOG TO DIGITAL CONVERSION

This invention relates to analog-to-digital (A/D) converters and, in particular, to means for generating a wide range of reference voltage steps particularly useful in A/D converters.

Figure 1:
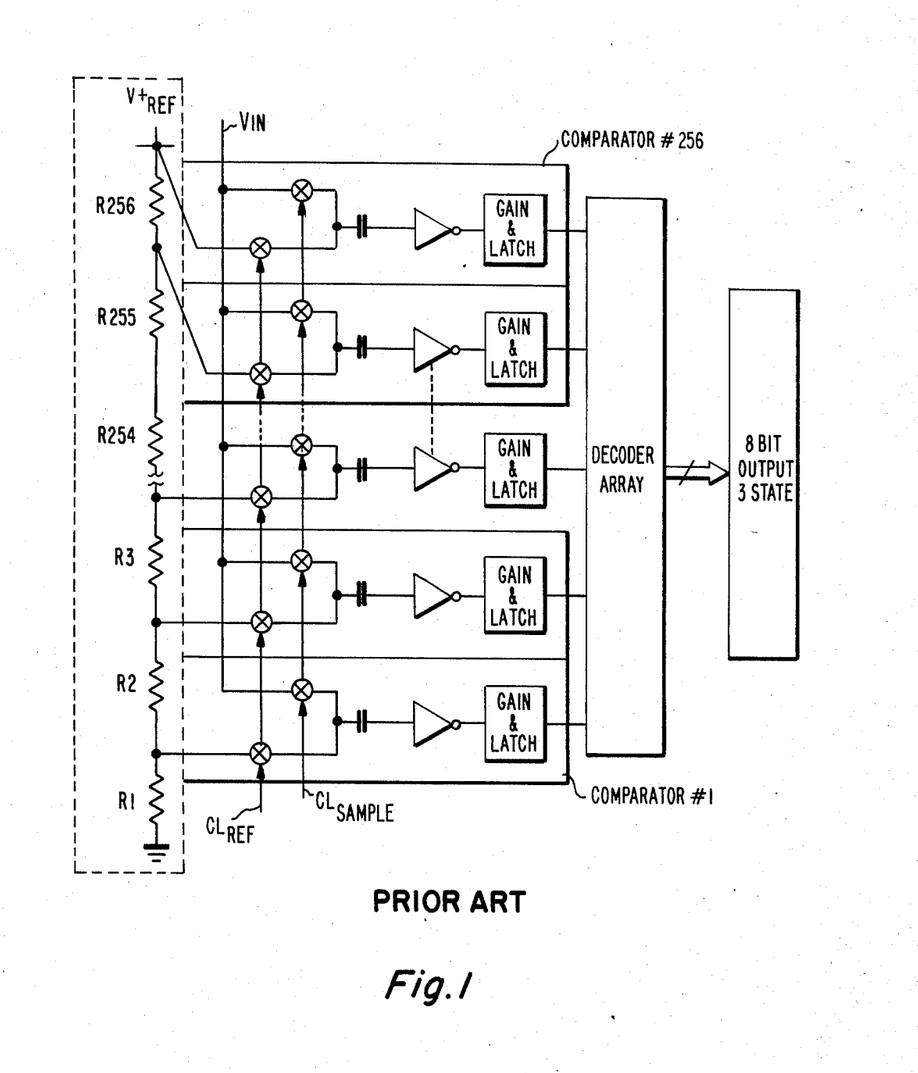
FIG. 1 is a partial schematic, partial block diagram of a prior art analog-to-digital converter.

In a prior art 8-bit "flash" A/D converter, shown in FIG. 1, a wide range of reference voltage steps is obtained by connecting a resistive network across a reference voltage and by making contact (taps) at known ohmic increments along the resistive network. The number of increments, or steps, and hence the number of taps along the resistive network is a function of the number of bits of resolution required. In general, for an "n"-bit system $2^n$ sub-reference steps are generated. Thus, in an "8-bit" A/D converter system—i.e. where "n" is equal to 8—the reference voltage of the system is subdivided into 256 substantially equal voltage steps by taps connected at equal ohmic increments along a resistive network connected between $V_{REF}+$ and $V_{REF}-$. Each tap is coupled via a corresponding transmission gate, which is selectively enabled by means of a reference clock ($CL_{REF}$) to a corresponding comparator. Thus, in the circuit of FIG. 1, 256 comparators are needed. This large number of comparators requires much space and dissipates considerable power. In circuits embodying the present invention, the number of comparators is significantly reduced.

The manufacture of the prior art resistive network with a large number of taps presents several problems. First, for proper operation, the total impedance of the resistive network must be made relatively small to prevent significant changes of the reference voltages at the various taps, when the taps are coupled via their associated transmission gates to the inputs of their associated comparators. Where the resistive network is formed on an integrated circuit, the need to make the resistive network a low impedance results in the resistive network being very large in area and occupying a substantial portion of the chip area. Second, the large number (e.g. 256) of subdivisions of a relatively small impedance requires that each subdivision be a proportionately smaller impedance. Where these small ohmic increments are in the range of several ohms or less, their values cannot be accurately controlled. Furthermore, coupling the taps of the resistive network to the capacitive input of the comparators causes significant loading and shifting of the reference voltages which is not uniform along the resistive network. The loading effect varies along the length of the resistive network being, typically, most pronounced at the extreme ends of the resistive network and least pronounced at the center of the network. For example, when the input voltage ($V_{IN}$) is being sampled the 256 comparator inputs are charged to the value of $V_{IN}$. When the reference voltage taps are subsequently coupled to the comparator inputs, the 256 capacitive comparator inputs either discharge into the resistive network or draw charge from the resistive network. The greatest disparity occurs, of course, when $V_{IN}$ is at the extreme of its range, i.e. at, or close to, zero volts or at, or close to, 5 volts, and the perturbation on the resistive network is most pronounced at the top end of the resistive network for $V_{IN}$ close to zero and at the bottom end of the resistive network for $V_{IN}$ close to $V_{REF}+$.

The problems discussed above are aggravated by the fact that the circuit is intended to be operated at relatively high speeds. Hence, the capacitor at the input of each comparator must be charged to its associated reference voltage step very quickly (e.g. within 25 nanoseconds). To charge or discharge the capacitances quickly, the impedance of the resistive network must be kept low.

The difficulties discussed above are significantly reduced or overcome in circuits embodying the invention.

In an n-bit A/D converter embodying the invention, a relatively low impedance coarse resistive network connected across a source of reference voltage is subdivided into $2^x$ coarse segments to produce $2^x$ coarse voltage steps. A relatively high impedance resistive element connected in parallel with each coarse segment is subdivided into $2^{(n-x)}$ fine sub-segments for subdividing each one of the $2^x$ coarse voltage steps into $2^{(n-x)}$ fine voltage steps, where n and x are integers, and x is less than n. The value of an input voltage is determined by first sensing which coarse segment brackets the input voltage and then comparing the input voltage with the fine reference voltage steps in the fine resistive element connected in parallel with the bracketing coarse segment.

In the accompanying drawings, like reference characters denote like components, and.

Figure 2:
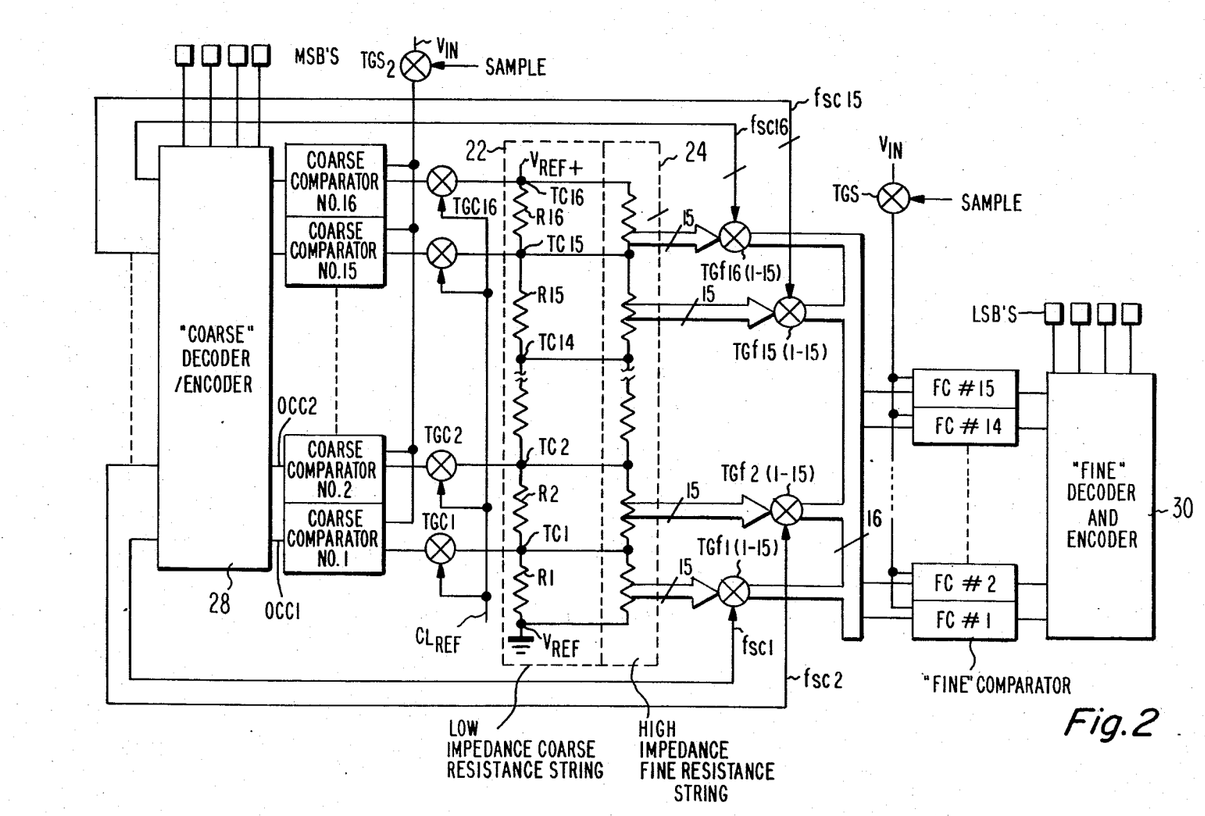
FIG. 2 is a partial schematic, partial block, diagram of an analog-to-digital converter embodying the invention.

FIG. 2 illustrates a configuration of an 8-bit "flash" A/D converter embodying the invention. The term "flash" normally refers to the fact that the analog-to-digital conversion or comparison is done in one step during one clock cycle. However, as detailed below, the circuit of FIG. 2 may be termed a two-step "flash" converter, with one step being used to determine the "coarse" value of an input voltage ($V_{IN}$) to its 4 most significant bits (MSB) and the second step being used to determine the "fine" value of $V_{IN}$ to its 4 least significant bits (LSB). The converter has been divided into two 4-bit sections whose outputs are subsequently recombined to produce the desired 8-bits of information.

One 4-bit section is denoted as the "coarse" section and the other 4-bit section is denoted as the "fine" section. The "coarse" section includes means for subdividing the reference voltage into $2^4$ "coarse" reference segments and to sense which coarse segment brackets the unknown input voltage being sampled (or measured). The "fine" section includes means for subdividing each $2^4$ coarse segments into $2^4$ fine sub-segments and to sense which fine sub-segment brackets the unknown input voltage being sampled. The coarse section includes a coarse resistor string 22 with $2^4$ coarse taps (TCi) located at equal increments along the string, $2^4$ transmission gates (TGCi) for coupling the $2^4$ taps to $2^4$ "coarse" comparators and a coarse logic array encoder 28. The "fine" section includes a fine resistor string 24 comprised of $2^4$ segments with each segment further subdivided into $2^4$ sub-segments with ($2^4-1$) fine taps formed between the $2^4$ fine sub-segments. The fine segment also includes ($2^4-1$) transmission gates per segment for coupling the ($2^4-1$) taps of a segment to the corresponding ($2^4-1$) fine comparators and a "fine" logic array encoder 30.

The coarse resistor element 22 may be formed by connecting discrete resistive elements of equal value, connected in series between $V_{REF}+$ and $V_{REF}-$ with taps formed or connected at the junctions between the resistors. Also, a tap (e.g. T16) may be connected to the end of the resistor (e.g. R16) connected to $V_{REF}+$. Alternatively, the coarse resistor network 22 may be formed of a single resistor element connected between the negative reference voltage $V_{REF}-$ and the positive reference voltage $V_{REF}+$. Taps are formed or connected, at substantially equal ohmic increments along the coarse I resistor element 22 to produce substantially equal voltage increments across the coarse segments located between each coarse tap. Consequently, the voltage increasing monotonically along the coarse resistor goes from the tap closest to $V_{REF}-$ to the tap closest to $V_{REF}+$.

The coarse resistor network 22 is a relatively low impedance resistance. By way of example, in the embodiment of FIG. 2, the total impedance of network 22 between $V_{REF}+$ and $V_{REF}-$ is approximately 500 ohms. Network 22 is divided into 16 (i.e. $2^4$) coarse segments of substantially equal ohmic (e.g. approximately 30 ohms each) increments to produce 16 substantially equal reference voltage steps, which can be represented by 4 bits. In the discussion to follow, it is assumed, for ease of illustration, that $V_{REF}-$ is ground and $V_{REF}+$ is 6.4 volts. Thus, the voltage drop ($\Delta VC$) across each coarse segment is 400 millivolts, with the voltage at a succeeding tap along the stack being 400 millivolts greater than the voltage at a preceding tap.

There are 16 "coarse" comparators (CCi), one comparator for each coarse tap along resistor network 22 including a sixteenth comparator for the tap to which $V_{REF}+$ is applied. The sixteenth comparator senses an overflow condition, i.e. when $V_{IN}$ is greater than $V_{REF}+$. In applications where it is not necessary to sense the overflow condition, the sixteenth comparator may be eliminated.

Corresponding to each coarse tap (TCi) on coarse resistor network 22 there is a coarse transmission gate (TGCi) for selectively coupling the coarse tap (TCi) to the reference input of its corresponding coarse comparator (CCi). The coarse comparators and the fine comparators may be of the same type as the comparator shown in FIG. 6. However, other suitable comparators may be used instead.

The outputs (OCCi) of the coarse comparators are applied to the coarse logic array decoder/encoder 28 which produces: (1) a coarse indication of the value of $V_{IN}$; and (2) control signals indicative of which coarse segment brackets the input voltage being sampled. Logic array decoder/encoder 28 may be of the type used in the CA3300 and CA3308 integrated circuits manufactured by RCA Corp. and described in data sheet published by RCA Corp. Alternatively, the decoder/encoder 28 may be any one of a number of known decoder/encoder arrangements capable of producing functions 1 and 2 noted above.

Figure 3:
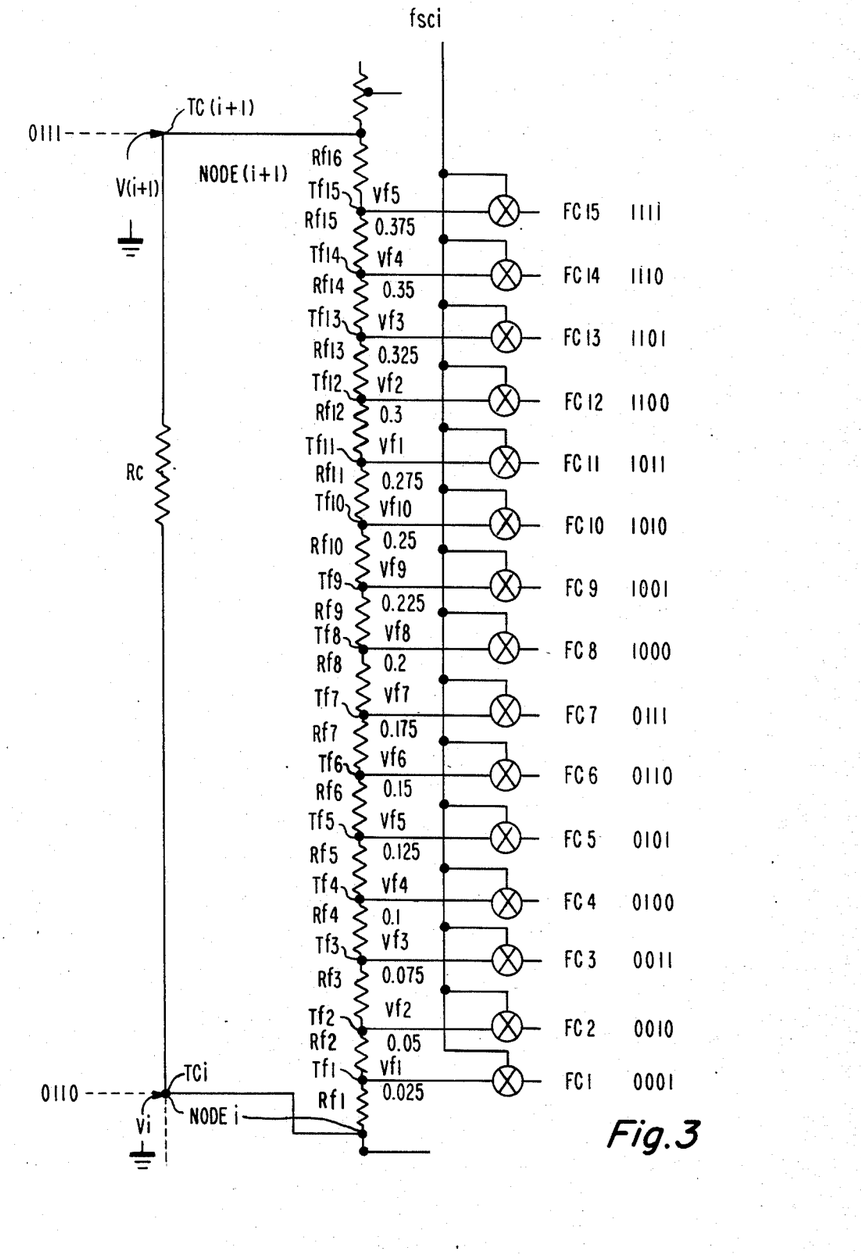
FIG. 3 is a detailed schematic diagram of a coarse resistor segment connected in parallel with a fine resistive element in accordance with the invention.

The fine resistor network 24 includes a relatively high impedance resistance connected in parallel with the relatively low impedance coarse resistor 22 between $V_{REF}-$ and $V_{REF}+$. Resistor network 24 is divided into 16 (e.g. $2^4$) fine resistive elements (or fine segments) with each fine resistive element being connected in parallel with a corresponding coarse segment as shown in FIG. 3. Each fine resistive element is further subdivided into $2^4$ (or 16) sub-segments to provide $2^4$ (or 16) fine reference voltage steps between each pair of "coarse" taps [TCi and TCi+1]. A fine tap (Tfi) is connected, or formed, at the junctions of every two fine sub-segments of each resistive element resulting in 15 fine taps (Tf1 through Tf15) at which are produced 15 different fine reference voltage levels ($V_{f1}$ through $V_{f15}$) between each pair of coarse taps. Thus, as shown in FIG. 3, for each coarse segment there is a set of 15 fine reference taps (Tfi's) which are given an ascending order going from Tf1 to Tf15 as the resistor network is ascended from node i to the next higher succeeding node (i+1). As for the case of the coarse resistor, each fine resistive element may be a single resistor string connected between two coarse taps with fine taps connected, or formed, at substantially equal ohmic increments along the string. Alternatively, the fine resistive element may be formed of substantially equal "discrete" resistors connected in series.

The total ohmic value of the fine resistive element between a pair of coarse taps is typically 100 times the ohmic value of the coarse resistor (Rc) connected between those two taps. By way of example, where the coarse value is approximately 30 ohms, the ohmic value of the fine resistive element is 3200 ohms and the impedance between any two fine taps is approximately 200 ohms. Hence the voltage level at each coarse tap is primarily determined by the coarse resistance.

A significant advantage of the circuit of the invention is that the fine resistor network 24 may be formed with relatively high impedance sections. The fine resistor network may thus be formed on an integrated circuit using relatively little space and dissipates considerable less power than the prior art circuitry.

Figure 4:
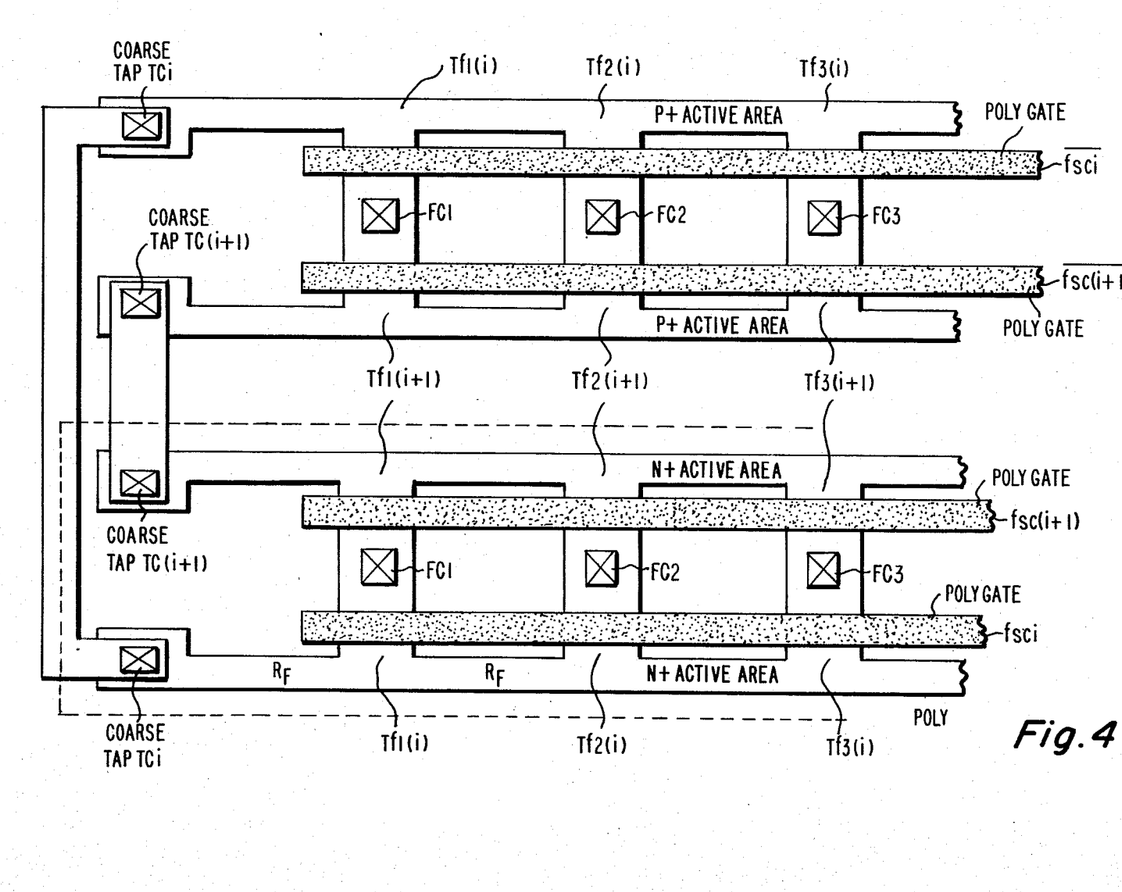
FIG. 4 is a top view of an elongated diffusion region used to form a "fine" resistive element in accordance with the invention.

A layout of a portion of a fine resistive element is shown in FIG. 4. In the circuit of the invention, each fine resistive element is formed of an elongated N diffusion and an elongated P diffusion which are essentially connected in parallel and which provide the required ohmic drops with extremely high packing density. P and N transistors are formed along the elongated diffusion to divide the diffusion into substantially equal ohmic increments. The layout shows tabs extending from the diffusions. These tabs provide the taps along the diffusions and these tabs/taps also function as the source/drain regions of the fine transmission gate transistors coupling their respective taps to the reference input of their corresponding fine comparator.

The use of N and P diffusions connected in parallel provides some significant advantages. The input voltage, $V_{IN}$, covers a dynamic range assumed, by way of example, to range between 0 and 6.4 volts. If a single MOS transmission gate were used to connect a tap to a comparator, the transmission gate transistor in several instances would conduct in the source follower mode—producing an offset. Also since the gates are driven by oppositely phased clock signals, switching charge injection is approximately neutralized resulting in faster settling.

Therefore, were a single N diffusion or a single P diffusion used to form the resistive element, a full (i.e. complementary) transmission gate would have to be used to couple the full fine tap voltages to the comparators. This would add another metal connection between the transmission gate and the N or the P-diffusion. This would make the wiring very difficult. By paralleling equal N and P diffusions, the source/drain regions of the transmission gate transistors are at the same potential at each respective tap. As a result, the wiring is minimized and the full dynamic range of the reference voltage and the input voltage can be fully utilized.

The N and P elongated diffusions forming the fine resistive element also form the source/drain regions of the transmission gate transistors used to couple the "tapped" points on the fine resistive element to the corresponding fine comparators.

Figure 5:
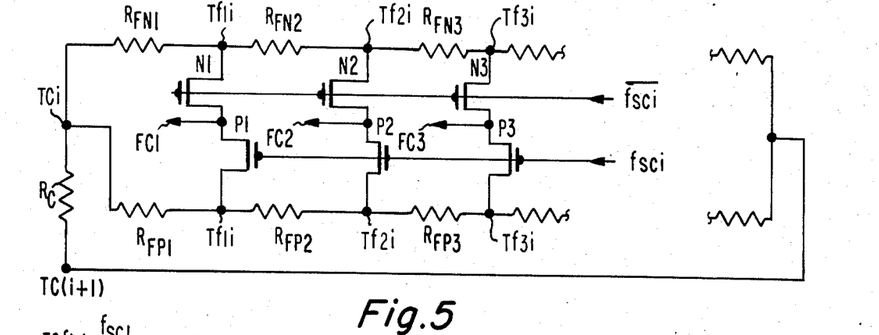
FIG. 5 is a detailed schematic diagram of an integrated "fine" resistive element embodying the invention.

The schematic circuit representation of the layout of FIG. 4 is shown in FIG. 5. Note that when $\overline{fsci}$ goes low and fsci goes high that each sub-segment (e.g. $R_{FN1}$) from the N-diffusion and its corresponding sub-segment from the P-diffusion (e.g. $R_{FP1}$) are connected in parallel via their respective transmission gate transistors (TGfN1 and TGfP1) to their corresponding fine comparator input (e.g. Fcl). Evidently analysis of the layout and the resulting schematic indicates that a very compact, low parasitic, and efficient layout has been produced.

There are 16 sets (TGfi) of fine transmission gates, each set being comprised of 15 transmission gates. Each set of fine transmission gates is enabled by a control signal (fsci) produced by coarse logic array 28. During operation of the A/D converter only one set of fine transmission gates is enabled at any one time. When the set of fine transmission gates is enabled the 15 fine taps associated with that set are coupled to their corresponding fine comparator inputs.

FIGS. 2 and 3 are intended to show that whenever a "coarse" segment "brackets" an input voltage, the 15 fine taps (Tfi) contained within the "bracketing" coarse segment are coupled in accordance with their ordered arrangement via 15 transmission gates TGfj (1-15) to the reference input of like ordered comparators.

Figure 6:
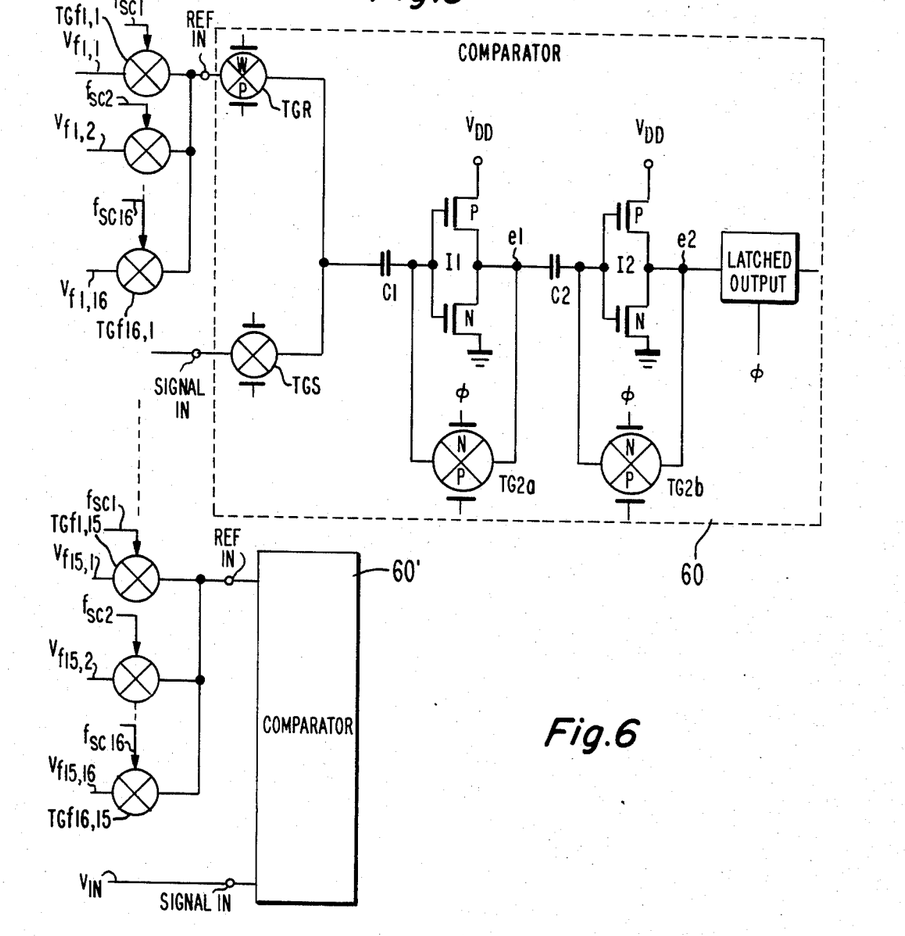
FIG. 6 is a schematic diagram of a comparator circuit useful in practicing the invention.

There are fifteen fine comparators (FC1 through FC15) which may be of the comparator type shown in FIG. 6 or which may be any one of a number of known comparator circuits whose outputs may be coupled to a storage device for latching and storage. The fine comparators have two inputs. One input is $V_{IN}$—the input signal being sampled. The other input is a "selected" fine reference voltage input. As shown in FIG. 6, the reference input to a comparator (i) is any one of 16 fine voltages $V_{fi}$. For example, the fine voltage ($V_{f1}$) from the first fine tap ($T_{f1}$) from each one of the 16 coarse segments are multiplexed via their corresponding fine transmission gate TGfj, 1 to the first fine comparator FC1. Likewise the fine voltage ($V_{f15}$) from the 15th fine tap ($T_{f15}$) from each one of the 16 coarse segments are applied via their corresponding fine transmission gates TGfj, 15 to FC15.

The signal and reference inputs are applied via their respective transmission gates, (TGR or TGS) to an input capacitor Cl, where their levels are compared. Their difference, if any, is amplified via inverters I1 and I2 which provide two stages of amplifications. The amplified output of I2 is applied to a latch which stores the signal for subsequent processing by logic array decoder/encoder 30.

The outputs (Ofci) of the comparators are applied to a fine logic array decoder/encoder circuit 30 (FIG. 2). Circuit 30 produces an output which indicates the value of an input voltage being sampled within its 4 least significant bits (LSB).

The operation of the A/D converter embodying the invention is best explained by reference to FIGS. 2 and 3. As before, it is assumed that:

(a) $V_{REF}+$ is at 6.4 volts;

(b) that $V_{REF}-$ is at ground; and (c) the voltage across each coarse segment is then 400 millivolts and increases in increments of 400 millivolts along the coarse network 22; and (d) the voltage across each fine sub-segment is then 25 millivolts and increases in increments of 25 millivolts along the fine network.

An input voltage ($V_{IN}$) to be sampled is applied via sampling transmission gates, TGS, which are momentarily enabled, to the inputs of the 16 coarse and 15 fine comparators. This contrasts to the prior art circuit where 256 comparators have to be charged or discharged. After the input signal is "inputted" the sampling transmission gates are disabled. However, the value of $V_{IN}$ remains stored at the inputs of the comparators. After sampling $V_{IN}$, a reference control signal $CL_{REF}$ is applied to enable all the coarse transmission gates (TGCi) concurrently.

The reference voltages present at each coarse tap (TCi) is then applied via its corresponding coarse transmission gate (TGCi) to the reference input of its corresponding coarse comparator (CCi).

The outputs (OCi) of each coarse comparator then produce a signal indicative of whether the coarse reference voltage (VCi) applied to the comparator is greater or less than the value of $V_{IN}$ previously applied to the comparator input.

For ease of description, assume that when $V_{IN}$ is greater than the local reference VCi, the output OCi of that comparator is driven "low" or logic "0" and that, when $V_{IN}$ is less than VCi, the output OCi goes high or logic "1".

Assume, by way of example, that a $V_{IN}$ having an amplitude of 612.5 millivolts is applied to the comparators. Subsequently, when the local reference voltages (VCi), are applied, OC1 goes low while the remaining coarse comparator outputs go high. All the coarse comparator outputs are applied to logic array decoder/encoder 28 which produces an enabling signal on signal line fsc2 and maintains a disabling signal on all the remaining fsci lines. That is, array 28 is designed to produce an enabling signal on fsc2 and a disabling signal on the other fsci's, when OC1 is low and OC2 (and the remaining OCi's) is high. Enabling fsc2 indicates that $V_{IN}$ lies in a range between VC1 and VC2 and that the fine sections across coarse segment R2 are to be selected. Decoder 28 also encodes the information received from the coarse comparators and produces the 4 most significant bits (MSB) of information regarding $V_{IN}$. Assuming that the voltage range between 0 volts and VC1 (or TC1) is assigned a binary value of 0000, the output lying between VC1 and VC2 will be read out as 0001 (i.e. greater than 0.4 volt and less than 0.8 volt).

The second step in determining the value of $V_{IN}$ follows. The enabling fsc2 signal enables the 15 fine transmission gates TGf2 (1-15) coupling all the fine reference voltages (Vfi's) produced across coarse segment R2 to their corresponding fine comparators FC1 through FC15.

Assume, as before, that the output (Ofi) of a fine comparator goes low when $V_{IN}$ is greater than the local reference voltage (Vfi) applied to the comparator input and Ofi goes high when $V_{IN}$ is less than Vfi.

For an assumed value of 612.5 millivolts, the fine comparators FC1 through FC8 will sense a $V_{IN}$ which is greater than the local Vfi's. Accordingly, the outputs (Of1 through Of8) of comparators FC1 through FC8 will be driven low.

The outputs, Of9 through Of15, of comparators FC9 through FC15 will have a "high" value indicating that $V_{IN}$ is less than V9 through V15. The outputs of the fine comparators are applied to fine logic array encoder 30. Encoder 30 is designed to respond to Of1 through Of8 being low and to Of9 through Of15 being high by producing a 4 bit code which represents the value of $V_{IN}$ within its 4 least significant bits (LSB).

The 4 LSB values generated would be 1000. Thus, combining the most significant bits produced during the first step with the least significant bits generated during the second step produces a binary read out for a $V_{IN}$ of 612.5 millivolts of:

| MSB | LSB |
| --- | --- |
| 0001 | 1000 |

Figure 7:
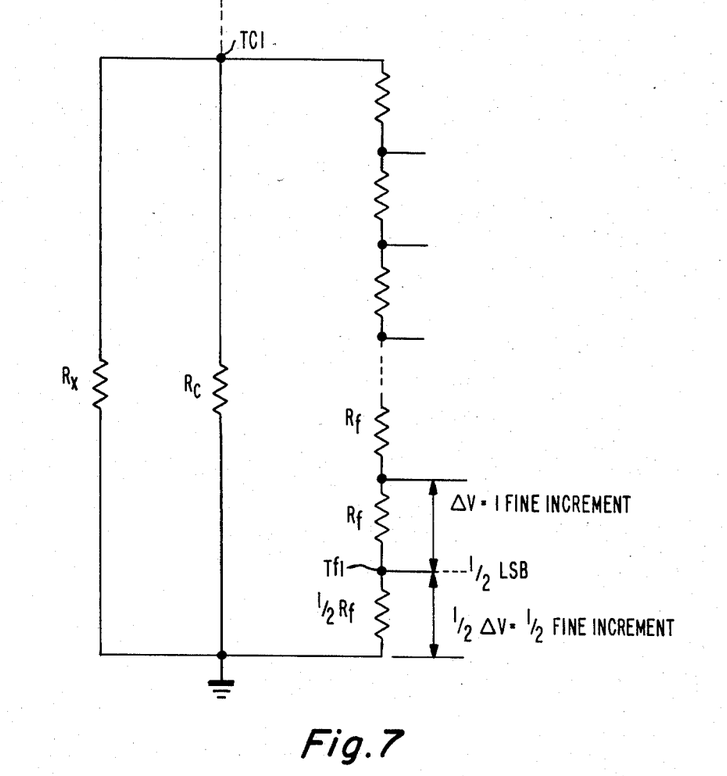
FIG. 7 is a schematic diagram of a section of a resistor network for producing fractional values of the voltages being sensed.

In the discussion above, the coarse and fine resistor networks were divided into equal increments. It should be appreciated that another advantage of using a coarse and a fine resistor network is that it enables the generation of reference voltages other than those discussed above, rather easily. For example, as shown in FIG. 7, the first tap (Tf1) along the fine network may be set a point which will produce a voltage V1 which is equal to one-half ($\frac{1}{2}$) the value of each fine increment ($\Delta V_f$). The succeeding taps along the fine network may be located a full fine increment apart. However the voltages at a tap (Tfi) may then be expressed as:

$$[i \cdot \Delta V - \tfrac{1}{2}\Delta V_f]$$

where i is the number of the tap along the fine network. This feature enables a comparator point to be set at $\frac{1}{2}$ the least significant bit, which is a desirable feature in this art.

The voltage across a particular coarse segment may also be controlled or varied easily. For example, in FIG. 7, a resistor Rx connected in parallel with Rc and having an ohmic value of 16 times Rc may be used to set the voltage at node TC1, to be one sixteenth less than the value of TC1 when Rx is removed from the circuit. This feature may be used in conjunction with the setting of the first fine tap at $\frac{1}{2}$ LSB to provide reference voltage comparisons at points which are one half the least significant bit levels.

In the discussion above the invention was illustrated when embodied in an 8-bit converter. Obviously, the invention is equally applicable to converters having greater or less bits of resolution. As a general proposition, the "n" bits will be divided into two sections. In the discussion above, the "n" bit were divided into two sections, each section for producing a like number of bits. However, the division need not be equal, although normally that would be most advantageous. Thus, one section may include X bits and the other section n−x bits. The one section (assume it to be the coarse section) then needs $2^x$ coarse segments and the other section (e.g. the fine section) needs $2^{(n-x)}$ fine sub-segments per coarse segment. Furthermore, the one (e.g. coarse) section will generally have up to $2^x$ taps while the other (e.g. fine) section will generally have $2^{(n-x)}-1$ taps.

Dividing the resistive network into two sections provides the following significant advantages:

(1) The total impedance is comparable to prior art, but 1/16th the number of comparators need to be charged or discharged.

(2) The speed/comparator is faster because there is less capacitance on the decoded LSB intermeshed ladder and the switching path is through only one transmission gate.

Although the total impedance of the coarse resistor network is comparable to the total impedance of the prior art networks, there are fewer metal contacts along the coarse resistor. As to the fine or high impedance network, the resistance between taps is significantly higher than in the prior art minimizing contact resistance variables. The total resistance is thus more favorably distributed.

The comparator count is down from 256 to 31, thus the charge injected into the resistor ladder is reduced 8 times.

What is claimed is:

1. In an "n"-bit analog-to-digital converter, where "n" is an integer greater than 2, a network for producing $2^n$ reference voltage increments comprising:
    first and second terminals for the application therebetween of a reference potential;
    a coarse, relatively low impedance, resistive network connected between said first and second terminals; said coarse network being divided into $2^x$ coarse segments for producing $2^x$ substantially equal ohmic increments; where x is an integer and is less than n; and
    a fine resistive element for each one of said $2^x$ coarse segments; each one of said fine resistive elements being connected in parallel with its corresponding coarse segment and each one of said fine resistive elements having a relatively high impedance compared to the coarse segment across which it is connected; each one of said fine elements being subdivided into $2^{(n-x)}$ fine sub-segments.

2. The combination as claimed in claim 1 wherein the impedance of each one of said fine elements is significantly greater than the impedance of the coarse segment across which it is connected.

3. The combination as claimed in claim 1 wherein $2^x$ coarse taps are formed, along said coarse network, one coarse tap being formed at the junction between every coarse segment and one coarse tap being formed at one end of said coarse network.

4. The combination as claimed in claim 3 wherein $[2^{(n-x)}-1]$ fine taps are formed along each one of said fine resistive element for producing $[2^{(n-x)}-1]$ taps across each one of said $2^x$ coarse segments.

5. The combination as claimed in claim 1 wherein the first fine sub-segment is of different ohmic value than the other fine sub-segment.

6. In an analog-to-digital converter for producing $2^n$ bits of resolution, the combination comprising:
    a coarse, relatively low impedance, resistive network connected between first and second terminals for the application therebetween of a reference potential; said coarse network being divided into $2^x$ coarse segments of approximately equal ohmic impedance for producing $2^x$ approximately equal coarse voltage increments; where n is an integer greater than two and x is an integer less than n;

a fine resisitve network connected between said first and second terminals; said fine network being divided into $2^x$ segments, one fine segment being connected in parallel across each coarse segment and each fine segment having a relatively high impedance compared to the coarse segment across which it is connected; each fine segment being further divided into $2^{(n-x)}$ fine sub-segments;

signal input terminal for receiving an input voltage whose amplitude is to be determined;

first comparator means for comparing said input voltage with said coarse voltage segments for ascertaining the coarse value range of the input voltage and for producing a control signal indicative of the coarse segment bracketing the input voltage; and second comparator means responsive to said control signal for comparing the input voltage with only the $2^{(n-x)}$ fine sub-segments connected in parallel with the coarse segment bracketing said input voltage.

7. The combination as claimed in claim 6 wherein said first comparator means includes no more than $2^x$ comparators; and wherein said first comparator means includes transmission gate means for coupling each one of said comparators to a different one of the $2^x$ segments along said coarse resistive network; and wherein said second comparator means includes no more than $[2^{(n-x)}-1]$ comparators, whereby the total number of comparators to produce $2^n$ bits of information does not exceed $2^x + 2^{(n-x)} - 1$ comparators.

8. The combination as claimed in claim 6 wherein each one of said fine segments connected across a coarse segment includes two diffused regions extending across the coarse segment, and wherein each one of these diffused regions is subdivided into said $2^{(n-x)}$ fine segments, and wherein the division is formed by means of a transistor of one conductivity type being connected at one end to one diffusion and a transistor of opposite conductivity type being connected at one end to the other diffusion and wherein the other end of the complementary pair of transistors is connected in common and coupled to its corresponding fine comparator input.

* * * * *